US006757397B1

(12) United States Patent
Buecher et al.

(10) Patent No.: US 6,757,397 B1
(45) Date of Patent: Jun. 29, 2004

(54) METHOD FOR CONTROLLING THE SENSITIVITY OF A MICROPHONE

(75) Inventors: Andreas Buecher, Osterode (DE); Wolfgang Baierl, Remshalden (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/444,282

(22) Filed: Nov. 19, 1999

(30) Foreign Application Priority Data

Nov. 25, 1998 (DE) ........................................ 198 54 373

(51) Int. Cl.[7] ........................... H04R 3/00; H03G 3/00; H04N 7/14; H04N 5/225; H04N 5/232

(52) U.S. Cl. ......................... 381/122; 381/107; 381/92; 348/169; 348/211; 348/14

(58) Field of Search .............................. 381/92, 26, 91, 381/122, 111–115, 107; 348/169, 211, 14.08, 14.09, 14.01, 211.12; 345/156–158

(56) References Cited

U.S. PATENT DOCUMENTS 4,807,051 A * 2/1989 Ogura ......................... 381/92
5,471,538 A * 11/1995 Sasaki et al. ................. 381/92
5,477,270 A * 12/1995 Park ........................ 348/222.1
5,548,335 A * 8/1996 Mitsuhashi et al. ......... 381/111
5,686,957 A * 11/1997 Baker .......................... 348/36
5,778,082 A * 7/1998 Chu et al. ...................... 381/92
5,940,118 A * 8/1999 Van Schyndel .......... 348/14.05
5,978,490 A * 11/1999 Choi et al. ..................... 381/92
6,243,471 B1 * 6/2001 Brandstein et al. ........... 381/92
6,275,258 B1 * 8/2001 Chim .................... 348/211.12
6,317,501 B1 * 11/2001 Matsuo ........................ 381/92
6,351,222 B1 * 2/2002 Swan et al. ............ 340/825.72
6,600,824 B1 * 7/2003 Matsuo ........................ 381/92
6,618,485 B1 * 9/2003 Matsuo ........................ 381/92

FOREIGN PATENT DOCUMENTS

DE 197 41 596 3/1999

* cited by examiner

*Primary Examiner*—Minsun Oh Harvey
*Assistant Examiner*—Laura A. Grier
(74) *Attorney, Agent, or Firm*—Kenyon & Kenyon

(57) ABSTRACT

A method for controlling the sensitivity of at least one microphone in which video data of a sound source, in particular a speech source, is recorded by a camera. The camera is located in a predetermined position relative to the at least one microphone. A position of the sound source relative to the at least one microphone is determined as a function of the recorded video data and/or a focus setting of a lens of the camera. The sensitivity of the at least one microphone is adjusted as a function of the determined position.

11 Claims, 3 Drawing Sheets

METHOD FOR CONTROLLING THE SENSITIVITY OF A MICROPHONE

BACKGROUND INFORMATION

A method in which the receiving sensitivity is adaptively adjusted as a function of the location of the useful sound source is described in German Patent No. 197 41 596. The sensitivity is controlled by evaluating audible signals received.

SUMMARY OF THE INVENTION

The method according to the present invention for controlling the sensitivity of at least one microphone has the advantage over the related art that video data of a sound source, in particular a speech source, is recorded by a camera, with the camera being located in a predetermined position relative to the at least one microphone; a position of the sound source relative to the at least one microphone is determined as a function of the recorded video data and/or a focus setting of a lens of the camera; and the sensitivity of the at least one microphone is adjusted as a function of the determined position. This makes it possible to adjust the sensitivity of the at least one microphone to the position of the sound source with an especially high degree of accuracy, requiring, in particular, no additional components if the camera is the camera of a videophone system and is therefore already provided. This increases the functionality of the camera. The at least one microphone can also be the microphone of the videophone system. During a video conference, the calling parties do not always find it easy to look directly into the camera while simultaneously speaking directly into the at least one microphone of the videophone system. For example, if the calling parties are working at a personal computer or perusing documents during the video conference, the actual direction in which they are speaking is often not in a direct line with the microphones. This means that incident noise from the environment is also transmitted. The method according to the present invention can be used to adjust the sensitivity of the at least one microphone to the actual speaking or sound direction once the latter has been determined by evaluating the video data and/or the focus setting of the lens, also making it possible to at least partially suppress the incident noise from the environment.

It is especially advantageous to adjust the sensitivity of the at least one microphone so that an audible signal emitted by the sound source at a first predetermined level in the direction of the at least one microphone is received by the at least one microphone at a second predetermined level. This ensures that, regardless of the distance between the sound source and the at least one microphone, the audible signals from the sound source are received at largely the same volume by the at least one microphone. For example, the volume thus remains largely constant when the speech is reproduced at a receiver of the videophone system regardless of the position in which the calling party, as the sound source, is located in front of the camera and regardless of the direction in which he is speaking.

A further advantage is the fact that the second predetermined level is set as a function of a reference position of the sound source relative to the at least one microphone. This makes it possible to adjust the sensitivity of the at least one microphone to the second predetermined level based on the reference position of the sound source, regardless of where the sound source is located, by determining the position of the sound source relative to its reference position and controlling the sensitivity accordingly.

One especially easy way to determine the position of the sound source relative to the at least one microphone is to determine a distance between the sound source and the at least one microphone as a function of the focus setting of the lens. This measure requires a minimum amount of effort.

The position of the sound source can be determined more precisely in that the position of the sound source is determined on the basis of the recorded video data by tracking at least one predetermined image segment of the sound source in consecutive images. Tracking only one image segment can save storage space for evaluating the video data, thus increasing the evaluation speed.

It is particularly advantageous to adjust a directional characteristic of the at least one microphone to the determined position of the sound source. This makes it possible to greatly suppress the reception of interference noise from the environment at the microphone.

It is particularly advantageous if audible signals from the sound source are received by two microphones; and, as the sound source moves in a way that reduces the distance from the sound source to a first microphone and increases the distance to a second microphone, the sensitivity of the second microphone is reduced and the sensitivity of the first microphone is adjusted so that an audible signal emitted by the sound source at the first predetermined level in the direction of the first microphone is received by the first microphone largely at the second predetermined level. This also makes it possible to greatly suppress interference noise from the environment when the audible signal is received by both microphones, since the different sensitivity settings of the two microphones also yield a directional characteristic that is adjusted to the determined position of the sound source. In addition, the audible signals are received by the microphones at a largely constant volume, regardless of the position of the sound source, so that the volume, in particular, remains largely constant when the speech is reproduced at the receiver of the videophone system.

DETAILED DESCRIPTION

Figure 1:
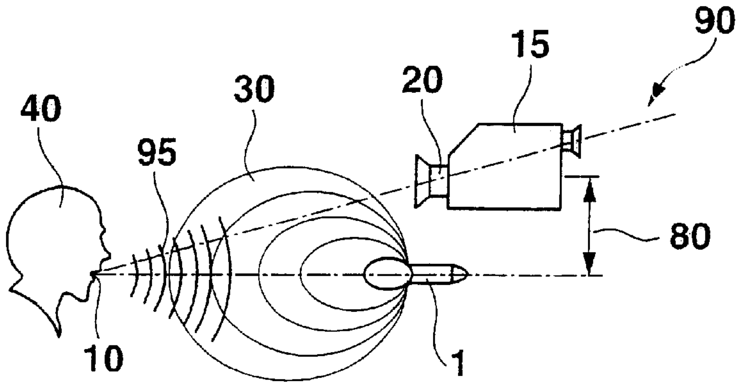
FIG. 1 shows an arrangement with a sound source, a microphone, and a camera.

In FIG. 1, reference number 10 designates a sound source, designed as a speech source, in the form of a human speech organ, with FIG. 1 illustrating a head 40 of a user of a videophone system 90. Videophone system 90 includes a camera 15 and a first microphone 1. Camera 15 is located in a predetermined position relative to first microphone 1, and has a first distance 80 to first microphone 1. Head 40 of the user is recorded by a lens 20 of camera 15, with camera 15 recording video data of head 40 including speech source 10. Speech source 10 emits speech signals in the form of sound waves 95 in the direction of first microphone 1. In the opposite direction, first microphone 1 has a first directional characteristic 30, which is oriented in the direction of sound wave 95.

Figure 2:
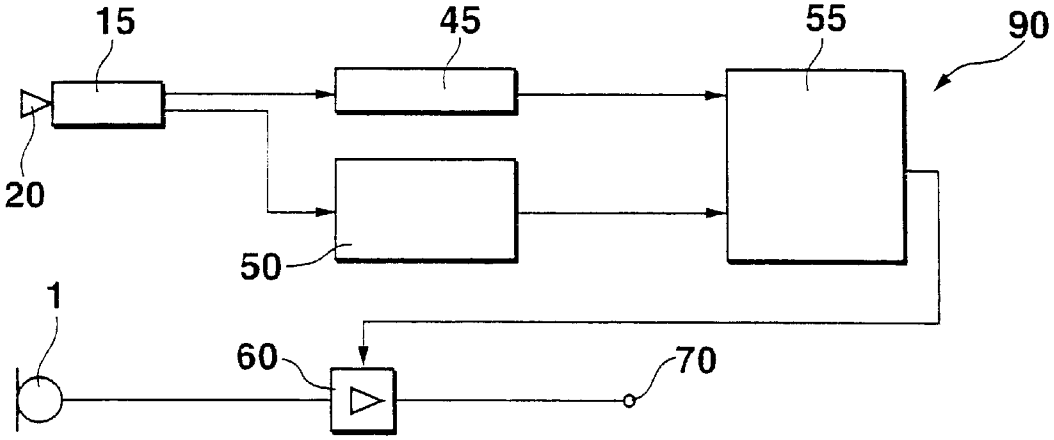
FIG. 2 shows a block diagram of the arrangement illustrated in FIG. 1.

FIG. 2 shows a block diagram of the arrangement illustrated in FIG. 1, with the same reference numbers identifying the same elements. A controller 55 is connected to camera 15 via an image processing unit 45 as well as via a focusing unit 50. Controller 55 controls a first level adjustment element 60, which adjusts the level of an audible signal received by first microphone 1 and supplies it to a first audio output 70.

Figure 5:
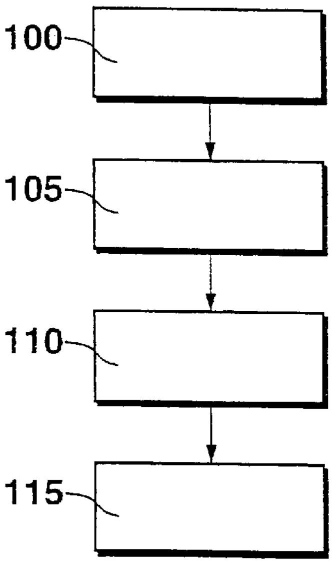
FIG. 5 shows a flowchart of the method according to the present invention.

The sequence of steps in the method according to the present invention is described on the basis of FIG. 5. In a first step 100, a reference position of head 40 including speech source 10 is recorded by lens 20 of camera 15 within a monitored image area 120 upon activation of videophone system 90. The user of videophone system 90 subsequently sets, on controller 55, a second predetermined level as the volume level for this reference position of speech source 10, for example using an input unit not illustrated in FIG. 2. Based on first distance 80, the second predetermined level is thus defined as a function of the reference position of speech source 10 relative to first microphone 1.

Figure 3:
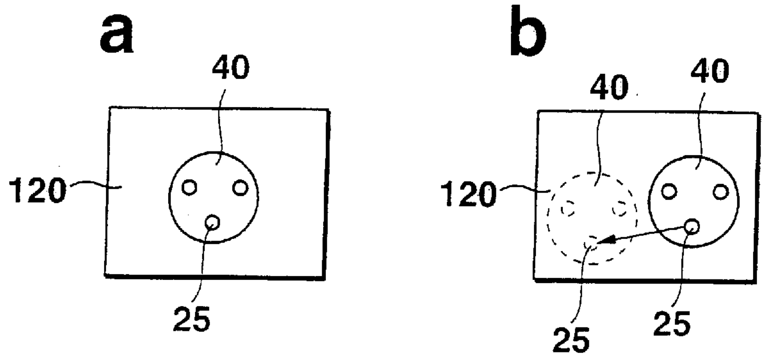
FIG. 3 shows an image evaluation system.

While videophone system 90 is active, camera 15 records video data of speech source 10, preferably in a digital manner, with the position of speech source 10 being determined in a second step 105 on the basis of the recorded video data by tracking at least one predetermined image segment 25 of speech source 10 in consecutive images. This procedure is illustrated in FIG. 3. Part a) of FIG. 3 shows head 40 in a reference position within image area 120, with image segment 25 being formed, for example, by the mouth of head 40, which is the location of speech source 10. As shown in part b) of FIG. 3, head 40 including predefined image segment 25 moves from a first position within image area 120, which is identified by a solid line, to a second position, which is identified in part b) of FIG. 3 by the dotted line, following the direction of the arrow. Image processing unit 45 is used to track image segment 25. In addition, image processing unit 45 can, in second step 105, determine the instantaneous relative distance from speech source 10 to camera 15 or to first microphone 1 relative to the reference position recorded in step 100 in that image processing unit 45 determines the size, e.g. the area or the scope, of image segment 25 in the instantaneous position of speech source 10 and compares it to the size of image segment 25 in the reference position. The relative distance can also be calculated by comparing the size of head 40 (or a different characteristic image segment of speech source 10 within image area 120) in the current position to the size of head 40 in the reference position. Alternatively or in addition to this, the relative distance from speech source 10 to camera 15 or to first microphone 1 relative to the reference position of speech source 10 can be determined in a third step 110 using focusing unit 50 by comparing the focus setting of lens 20 for focusing image segment 25 in the instantaneous position to the focus setting of lens 20 for focusing image segment 25 in the reference position. The size of image segment 25 or head 40 in the reference position and/or the focus setting of lens 20 for focusing image segment 25 in the reference position can be stored in the form of data in a storage device (not illustrated in FIG. 2) of videophone system 90.

Figure 4:
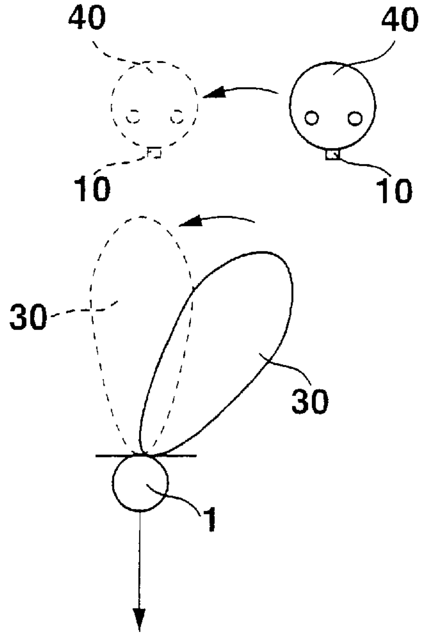
FIG. 4 shows a microphone with a directional characteristic.

In a fourth step 115, controller 55 then uses first level adjustment element 60 to adjust the sensitivity of first microphone 1 as a function of the determined instantaneous position of image segment 25 relative to the reference position of image segment 25, based on the results obtained in second step 105 and/or in third step 110. Controller 55 then uses first level adjustment element 60 to adjust the sensitivity of first microphone 1 in fourth step 115 so that an audible signal emitted by speech source 10 at a first predetermined level in the direction of first microphone 1 is received by first microphone 1 at the second predetermined level. Regardless of the distance between speech source 10 and first microphone 1, it is therefore possible to output a speech signal at first audio output 70 at a constant volume, using a speech reproduction unit (not illustrated in FIG. 2) which can reproduce the speech signals at a largely constant volume. If the position of image segment 25 shown in part b) of FIG. 3 changes within image area 120, controller 55 can also control the sensitivity of first microphone 1 in the fourth step by changing first directional characteristic 30 using first level adjustment element 60. FIG. 4 shows a corresponding change in first directional characteristic 30 of first microphone 1 for a shift in the location of head 40 including image segment 25. First directional characteristic 30 forms a loop that is oriented in the direction of speech source 10 and therefore rotates along with the movement of speech source 10.

Interfering incident noise from the environment of speech source 10 can be greatly suppressed by adjusting first directional characteristic 30 of first microphone 1 to the present position of speech source 10.

Figure 6:
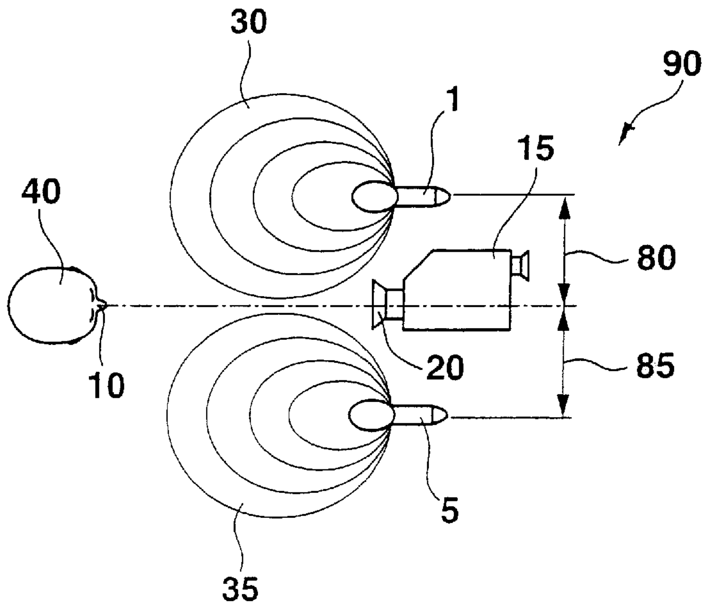
FIG. 6 shows an arrangement including a sound source, two microphones, and a camera.

The directional characteristic can also be varied by using multiple microphones. For this purpose, FIG. 6 shows an example of videophone system 90 with first microphone 1 and a second microphone 5, with both microphones 1, 5 being located in a predetermined position relative to camera 15. In FIG. 6, the same reference numbers identify the same elements. Thus, first microphone 1 is again permanently positioned at first distance 80 from camera 15. Second microphone 5 is permanently positioned at a second distance 85 from camera 15. First microphone 1 has first directional characteristic 30, and second microphone 5 has a second directional characteristic 35.

Figure 7:
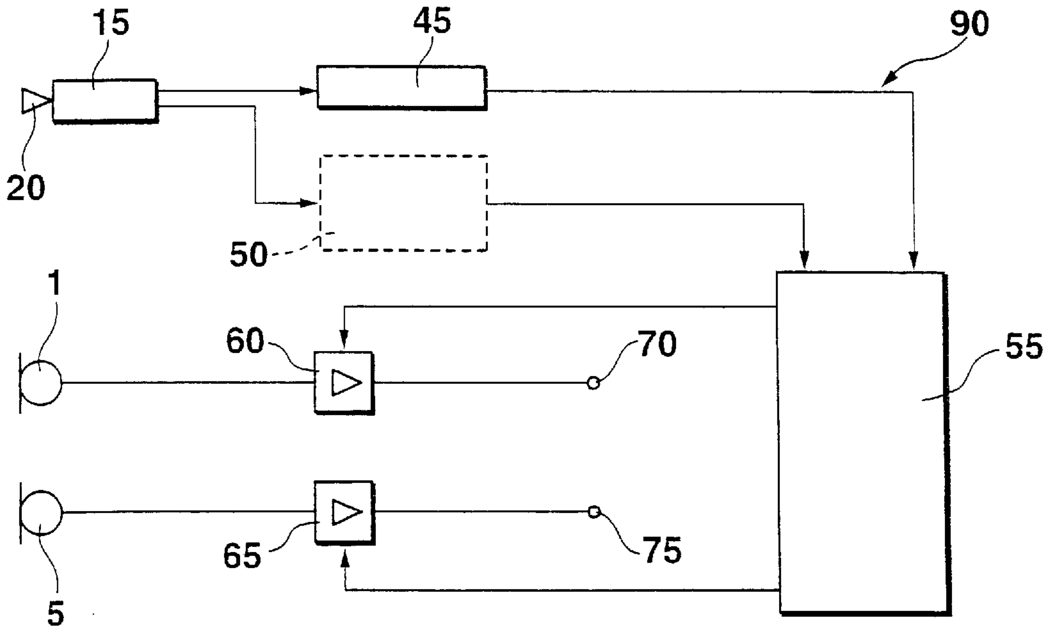
FIG. 7 shows a block diagram of the arrangement illustrated in FIG. 6.

FIG. 7 shows a block diagram of the arrangement illustrated in FIG. 6. In FIG. 7 as well, the same reference numbers identify the same elements. The block diagram in FIG. 7 corresponds to the block diagram in FIG. 2, with the block diagram shown in FIG. 7 additionally containing the driving arrangement of a second level adjustment element 65 for controlling the sensitivity of second microphone 5 and for adjusting a corresponding volume level at a second audio output 75. In addition, focusing unit 50 is represented by a dotted line in FIG. 7 because it is, according to the description, an optional component.

The microphone sensitivity is controlled according to the four steps 100, 105, 110, 115 described above. The embodiment illustrated in FIG. 7 differs from the embodiment shown in FIG. 2 in that audible signals from speech source 10 are now received by both microphones 1, 5 so that, when speech source 10 moves in a way that reduces the distance from speech source 10 to first microphone 1 and increases the distance to second microphone 5, the sensitivity of second microphone 5 is reduced in fourth step 115 and the sensitivity of first microphone 1 is adjusted so that an audible signal emitted by speech source 10 at the first predetermined level in the direction of first microphone 1 is received by first microphone 1 largely at the second predetermined level. If controller 55 uses first level adjustment element 60 and second level adjustment element 65 to set different microphone sensitivities, this yields a common superimposed directional characteristic, which resembles the directional characteristic illustrated in FIG. 4, so that the superimposed directional characteristic of both microphones 1, 5 is adjusted to the determined position of speech source 10 and corresponding interfering incident noise from the environment of speech source 10 can be largely suppressed without both microphones 1, 5 having to be directional microphones. According to the arrangement shown in FIG. 7 the superimposed output signal at both audio outputs 70, 75 also enables the speech to be reproduced at a largely constant volume regardless of the position of speech source 10, in particular its distance to both microphones 1, 5. For this purpose, it may be necessary to reduce the sensitivity of first microphone 1 as speech source 10 moves in the direction of first microphone 1 by adjusting first level adjustment element 60 correspondingly.

Increasing the number of microphones connected to videophone system 90 for picking up audible signals from speech source 10, makes it possible to also increase the variability and adjustability of the superimposed directional characteristics of the microphones used to the position of speech source 10 so that interfering incident noise from the environment of speech source 10 can be suppressed more and more effectively, reproducing the speech by superimposing more and more uniform volumes on the corresponding audio outputs of the microphones used regardless of the position of speech source 10.

The audio signals present at the audio outputs can be further processed through analog or digital means. Camera 15 can be a digital camera, although any other camera that enables the image to be processed in image processing unit 45 can also be used, with it also being possible to digitize analog video data recorded by an analog camera 15 using an analog/digital converter before it is further processed in image processing unit 45, for example.

To determine the instantaneous position of speech source 10, particularly when speech source 10 moves rapidly, it is necessary to define an adequately large image area 120 and to position camera 15 so that speech source 10 is located as close as possible to the middle of image area 120 when in its reference position. In the simplest scenario, monitored image area 120 remains constant.

The audio signals at first audio output 70 shown in FIG. 2, and the superimposed audio signals at both audio outputs 70, 75 shown in FIG. 7 can be supplied either to a speech reproduction unit, for example a loudspeaker, of videophone system 90 for audible reproduction, or to a telecommunication network for transmission to another subscriber in the telecommunication network.

The method described is not limited to use in a videophone system, but can be used wherever the sensitivity of at least one microphone needs to be adjusted as a function of the position of a sound source.

What is claimed is:

1. A method for controlling a sensitivity of at least one microphone, comprising the steps of:

recording video data of a speech source using a camera, the camera being situated in a predetermined position relative to the at least one microphone;

determining a position of the speech source relative to the at least one microphone as a function of at least one of the recorded video data and a focus setting of a lens of the camera;

adjusting the sensitivity of the at least one microphone as a function of the determined position, wherein the sensitivity of the at least one microphone is adjusted so that an audio signal emitted by the speech source at a first predetermined level in a direction of the at least one microphone is received by the at least one microphone at a second predetermined level; and setting the second predetermined level as a function of a references position of the speech source relative to the at least one microphone.

2. The method according to claim 1, further comprising the step of determining a distance between the speech source and the at least one microphone as a function of the focus setting of the lens.

3. The method according to claim 1, wherein the at least one microphone is a component of a videophone system.

4. A method for controlling a sensitivity of at least one microphone, comprising the steps of:

recording video data of a speech source using a camera, the camera being situated in a predetermined position relative to the at least one microphone;

determining a position of the speech source relative to the at least one microphone as a function of at least one of the recorded video data and a focus setting of a lens of the camera;

adjusting the sensitivity of the at least one microphone as a function of the determined position, wherein the position of the speech source is determined on the basis of the recorded video data by tracking at least one predetermined image segment of the speech source in consecutive images; and calculating a distance between the speech source and the at least one microphone from the at least one image segment as a function of at least one of an area and a scope of the at least one image segment.

5. The method according to claim 4, wherein the image segment includes a mouth of a head.

6. The method according to claim 4, wherein the distance is determined by comparing a first size of the speech source in a current position to a second size of the speech source in a reference position.

7. A method for controlling a sensitivity of at least one microphone, the at least one microphone including a first microphone and a second microphone, the method comprising the steps of:

recording video data of a speech source using a camera, the camera being situated in a predetermined position relative to the at least one microphone;

determining a position of the speech source relative to the at least one microphone as a function of at least one of the recorded video data and a focus setting of a lens of the camera;

adjusting the sensitivity of the at least one microphone as a function of the determined position;

receiving audible signals from the speech source at the first and second microphones; and as the speech source moves in a way that reduces a first distance from the speech source to the first microphone and increases a second distance from the speech source to the second microphone, reducing a sensitivity of the second microphone and adjusting a sensitivity of the first microphone so that an audible signal emitted by the speech source at a first predetermined level in a direction of the first microphone is received by the first microphone largely at a second predetermined level.

8. An apparatus for controlling a sensitivity of at least one microphone, comprising:

a camera having a lens, the camera being situated a predetermined position relative to the at least one microphone;

an imaging processing unit;

a focusing unit;

a level adjustment element operable to adjust a level of an audible signal received by the at least one microphone; and a controller communicatively coupled to the camera via the image processing unit and the focusing unit, the controller being operable to control the level adjustment element; wherein video data of a speech source is recorded using the camera, a position of the speech source relative to the at least one microphone is determined as a function of at least one of the video data and a focus setting of the lens of the camera, and the sensitivity of the at least one microphone is adjusted as a function of the determined position;

wherein the sensitivity of the at least one microphone is adjusted so that an audio signal emitted by the speech source at a first predetermined level in a direction of the at least one microphone is received by the at least one microphone at a second predetermined level; and wherein the second predetermined level is set as a function of a reference position of the speech source relative to the at least one microphone.

9. The apparatus according to claim 8, wherein a distance between the speech source and the at least one microphone is determined as a function of the focus setting of the lens.

10. The apparatus according to claim 8, wherein the position of the speech source is determined on the basis of the video data by tracking at least one predetermined image segment of the speech source in consecutive images.

11. An apparatus for controlling a sensitivity of at least one microphone, comprising:

a camera having a lens, the camera being situated a predetermined position relative to the at least one microphone;

an imaging processing unit;

a focusing unit;

a level adjustment element operable to adjust a level of an audible signal received by the at least one microphone; and a controller communicatively coupled to the camera via the image processing unit and the focusing unit, the controller being operable to control the level adjustment element; wherein video data of a speech source is recorded using the camera, a position of the speech source relative to the at least one microphone is determined as a function of at least one of the video data and a focus setting of the lens of the camera, and the sensitivity of the at least one microphone is adjusted as a function of the determined position;

wherein the position of the speech source is determined on the basis of the video data by tracking at least one predetermined image segment of the speech source in consecutive images; and wherein a distance between the speech source and the at least one microphone is calculated from the at least one image segment as a function of at least one of an area and a scope of the at least one image segment.

* * * * *